(12) United States Patent
Soules et al.

(10) Patent No.: US 7,479,662 B2
(45) Date of Patent: Jan. 20, 2009

(54) COATED LED WITH IMPROVED EFFICIENCY

(75) Inventors: Thomas F. Soules, Livermore, CA (US); Stanton Weaver, Jr., Northville, NY (US); Chen-Lun Hsing Chen, Sanchong (TW); Mathew Sommers, Sagamore Hills, OH (US); Boris Kolodin, Beachwood, OH (US); Anan Achyut Setlur, Niskayuna, NY (US); Thomas Elliot Stecher, Scotia, NY (US)

(73) Assignee: Lumination LLC, Valley View, OH (US)

( * ) Notice: Subject to any disclaimer, the term of this patent is extended or adjusted under 35 U.S.C. 154(b) by 266 days.

(21) Appl. No.: 10/525,697

(22) PCT Filed: Aug. 29, 2003
(Under 37 CFR 1.47)

(86) PCT No.: PCT/US03/27363

§ 371 (c)(1),
(2), (4) Date: Mar. 23, 2006

(87) PCT Pub. No.: WO2004/021461

PCT Pub. Date: Mar. 11, 2004

(65) Prior Publication Data

US 2007/0120135 A1    May 31, 2007

Related U.S. Application Data

(60) Provisional application No. 60/407,426, filed on Aug. 30, 2002.

(51) Int. Cl.
*H01L 29/22*     (2006.01)
*H01L 29/24*     (2006.01)
*H01L 33/00*     (2006.01)
*H01L 21/00*     (2006.01)
*H01J 63/04*     (2006.01)

(52) U.S. Cl. ............... 257/98; 257/99; 257/100; 257/88; 438/26; 438/29; 438/69; 313/512

(58) Field of Classification Search ............... 257/98, 257/99, 100, 88; 438/26, 29, 69; 313/512
See application file for complete search history.

(56) References Cited

U.S. PATENT DOCUMENTS 5,093,576 A    3/1992    Edmond (Continued)

FOREIGN PATENT DOCUMENTS

CA    2220031    1/2004

(Continued)

*Primary Examiner*—Luan Thai
(74) *Attorney, Agent, or Firm*—Fay Sharpe LLP (57) ABSTRACT

An LED device including an LED chip and a lens positioned apart from the chip and coated with a uniform thickness layer of fluorescent phosphor for converting at least some of the radiation emitted by the chip into visible light. Positioning the phosphor layer away from the LED improves the efficiency of the device and produces more consistent color rendition. The surface area of the lens is preferably at least ten times the surface area of the LED chip. For increased efficiency, the reflector and submount can also be coated with phosphor to further reduce internal absorption.

30 Claims, 9 Drawing Sheets

U.S. PATENT DOCUMENTS

| | | | |
|---|---|---|---|
| 5,959,316 | A | 9/1999 | Lowery |
| 5,962,971 | A | 10/1999 | Chen |
| 6,204,523 | B1 | 3/2001 | Carey |
| 6,340,824 | B1 * | 1/2002 | Komoto et al. ................ 257/99 |
| 6,504,301 | B1 | 1/2003 | Lowery |
| 6,590,235 | B2 | 7/2003 | Carey |
| 6,660,175 | B2 | 12/2003 | Kawamura et al. |
| 6,661,030 | B2 | 12/2003 | Komoto |
| 6,765,237 | B1 * | 7/2004 | Doxsee et al. ................ 257/98 |
| 6,812,503 | B2 | 11/2004 | Lin et al. |
| 7,029,935 | B2 | 4/2006 | Negley et al. |
| 7,101,061 | B2 | 9/2006 | Hagai et al. |
| 2001/0000622 | A1 | 5/2001 | Reeh |
| 2002/0043926 | A1 | 4/2002 | Kaga |
| 2002/0079506 | A1 | 6/2002 | Konno |
| 2002/0079837 | A1 | 6/2002 | Okazaki |
| 2005/0093430 | A1 | 5/2005 | Ibbetson |

FOREIGN PATENT DOCUMENTS

| | | |
|---|---|---|
| CA | 2496937 | 3/2004 |
| CA | 2515647 | 9/2004 |
| CA | 2517009 | 9/2004 |
| CA | 2523544 | 11/2004 |
| CA | 2549822 | 5/2005 |
| DE | 4208172 B4 | 5/2006 |
| EP | 0415640 | 3/1991 |
| EP | 0854523 | 7/1998 |
| EP | 859967 B1 | 8/1999 |
| EP | 1 191 608 A | 3/2002 |
| EP | 94247 B1 | 4/2006 |
| EP | 1573870 | 7/2007 |
| GB | 2347018 A | 8/2000 |
| GB | 2413896 A | 9/2005 |
| GB | 2424123 A | 9/2006 |
| JP | 07 193281 | 7/1995 |
| JP | 10-282916 | 10/1998 |
| JP | 2000-101148 | 4/2000 |
| JP | 2000-315822 | 11/2000 |
| JP | 2000-315824 | 11/2000 |
| JP | 2001-057445 | 2/2001 |
| JP | 01-173239 | 6/2001 |
| KR | 100405453 | 11/2003 |
| TW | 457731 B | 12/1999 |
| WO | WO 00/57490 | 9/2000 |
| WO | WO 01/40702 | 6/2001 |
| WO | WO 2004/075308 | 2/2004 |
| WO | WO 2004/023522 | 3/2004 |
| WO | WO 2004/077580 | 10/2004 |
| WO | WO 2004/100279 | 11/2004 |
| WO | WO 2005/043627 | 5/2005 |

* cited by examiner

COATED LED WITH IMPROVED EFFICIENCY

CROSS REFERENCE TO RELATED APPLICATION

This application is a 371 of PCT/US03/27363 filed Aug. 29, 2003, which claims benefit of No. 60/407,426 filed Aug. 30, 2002, entitled "Coated LED with Improved Efficiency", the disclosures of which are hereby incorporated by reference herein.

BACKGROUND OF THE INVENTION

This invention relates to a light emitting device comprising a UV or blue light emitting diode or laser diode (LED) and an excitable phosphor. More specifically, the present invention relates to a phosphor coated LED having a specific geometry disclosed for the coating designed to improve the efficiency of the LED.

There is currently a market for LED's for general illumination, so called "white LED's". These "white LED's" emit radiation that appears substantially white to those that perceive it. The most popular white LED's consist of blue emitting GaInN epitaxially grown layers on sapphire (single crystal alumina) or single crystal SiC. The blue emitting chips are coated with a phosphor that converts some of the blue radiation to a complimentary color, e.g. a yellow-green emission. Together the blue and yellow-green emission produces a white light typically with a correlated color temperature of about 5000K and a color rendition index, Ra, equal to about 70-75. There are also white LED's which utilize a UV emitting chip and phosphors designed to convert the UV radiation to visible light. Typically, two or more phosphor emission bands are required.

White phosphor coated LED's typically have package efficiencies of about 50-70%. The package efficiency is defined as the ratio of the actual light output of the LED to the light that would be obtained if all the radiation generated escaped from the package without being absorbed. In the invention described herein, package efficiencies approaching 100% can be realized.

Historically, phosphor coated LED's have rather low package efficiencies partly because phosphor particles generate light that is radiated equally in all directions. Some of this light invariably is directed toward the LED chip, substrate, submount, and lead structure. All these elements absorb some of this light. In addition because the phosphors typically are not perfect absorbers of long wavelength UV or blue radiation some of the initial excited radiation emitted by the LED chip itself is also reflected back onto the aforementioned structural elements. Finally in the case of UV emitting chips, in order to absorb all the UV and avoid UV bleed through, the phosphor coating must typically be relatively thick, at least 5-7 particles thick. This further increases the coating's visible reflectance. The light lost due to absorption of radiation by the LED chip, submount, reflector and lead structure limits the package efficiency.

As mentioned, typical package efficiencies are 50-70%. Hence there is a significant opportunity for improving the efficiency of LED packages if the package efficiency could be increased to near 100%. Fluorescent lamps, for example, which also utilize phosphor coatings, have package efficiencies close to 100% mainly because the light which is generated by the phosphor coating and radiated back into the lamp does not strike any absorbing structures.

Another major problem that is addressed by the present invention is phosphor coating uniformity. Current designs leading to the above-mentioned package efficiencies typically have the blue or UV emitting chip mounted on a substrate and then placed in a silver coated reflector cup. The cup is filled with a silicone or silicone epoxy with the phosphor powder embedded in it. Phosphor particles are distributed randomly in the silicone slurry, which, in addition to the above-mentioned effect of reduced package brightness due to scattering light back, the relative phosphor thickness also differs greatly over the geometry of the coating. This results in color separation in the beam pattern. It also leads to different colors for different parts due to different coating patterns and thicknesses as well as undesirable blue or yellow rings in the LED emission pattern.

The problem of phosphor coating uniformity has been addressed in U.S. Pat. No. 5,959,316, in which a uniformly thick fluorescent or phosphor layer is separated from an LED chip by a transparent spacer. The entire assembly is then embedded in a transparent encapsulation epoxy resin.

Another problem that is encountered in conventional LED packages is that the efficiency of the phosphor is decreased when it is positioned in a layer on top of or adjacent the LED chip. This is due to the residual heat of the chip warming the phosphor and changing its emission characteristics. Still another drawback to conventional LED packages is that, due to the fact that the phosphor coating is applied non-uniformly, the total amount of phosphor used is often more than is necessary for the efficient conversion of the light emitted by the chip. Phosphor compositions are relatively expensive and this additional amount increases the total cost of the LED significantly.

One way to minimize light losses in LED's is to insure that the submount, reflector and lead structure are coated with as large amount of reflecting material as possible. Most manufacturers practice this approach. Nevertheless, the LED chip itself, especially in the case of a chip with a SiC substrate, absorbs significant amounts of both its own radiation and that of the phosphor radiation. Further, other parts of the LED structure, for example the submount, are rather strongly absorbing of visible and near UV radiation. Surprisingly, even silver coated reflector and lead structure elements are somewhat absorbing of both of these radiations. Due to this absorption and the fact that so much of the radiation bounces between the phosphor coating and the LED structure, package efficiencies exceeding 50-70% are rarely realized even with coated surfaces.

One alternate approach to putting the phosphor in the silicone in a reflector cup is practiced in LumiLED's LUXEON™ LED products. In these designs, the emitting LED chip is coated with a thin conformal coating of phosphor. This arrangement reduces non-uniformity in the thickness of the coating over the chip as well as promoting LED to LED color uniformity. However, it may actually decrease the overall efficiency of the LED because the chip and submount are absorbing and more than half the radiation generated by the phosphor coating is reflected directly back onto these components.

Therefore, it would be advantageous to design a phosphor coated LED having a maximum light output by increasing the package efficiency of the LED to above 70%, and preferably close to 100%.

Further, it would be desirable to produce UV/phosphor or blue/phosphor white LED's with a uniform phosphor layer and consistent color throughput and, in the case of UV emitting chips, an LED without significant amount of UV radiation leakage to the environment.

It is further desirable to increase the efficiency of the phosphor conversion by applying a uniform coating thickness of the phosphor and positioning this coating away from the LED chip to prevent heat from the chip from being transmitted thereto.

In addition, it is desirable to minimize color shift of the LED due to current fluctuations. A color shift with current is often observed in phosphor coated LED's due to the high radiation flux density on the phosphor, which tends to saturate the phosphor by depleting the ground state of certain activators. In the invention described herein, by remotely coating the phosphor the blue flux density (W) from the LED chip is greatly decreased.

BRIEF DESCRIPTION OF INVENTION

In one aspect, the invention provides an LED lighting assembly comprising an LED chip and a phosphor coated surface, the phosphor coated surface having a surface area about at least 10 times the surface area of the LED chip.

In a second aspect, the invention provides an LED lighting assembly comprising an LED chip and a substantially uniform thickness phosphor coating applied to a transparent lens remote from the LED chip.

In a third aspect, the invention provides a method for forming an LED lighting assembly including the steps of providing an LED chip on a mounting surface, applying a phosphor coating to a transparent lens, and attaching said lens to said mounting surface such that light emitted from said LED chip is transmitted to said lens.

In a fourth aspect, the invention provides a method for forming an LED lighting assembly including the steps of dispersing a phosphor in a binder and a solvent to form a phosphor mixture, applying said phosphor mixture to a transparent lens, curing said binder, and attaching said lens to a mounting surface over an LED chip.

Preferably, a phosphor coating is provided which completely surrounds the LED chip and has a coverage area at least approximately 10 times the exposed area of the absorbing parts of the LED. In most cases, such as when the phosphor is coated on a hemisphere or similar geometry structure, such a requirement is met by removing the phosphor coated surface from the chip by at least a distance 2-3 times the length of the longest side of the chip and surrounding the chip such that no radiation can escape without striking the phosphor coated surface. Radiation generated or reflected off such a coating has an increased probability of striking other parts of the coating rather than the chip, submount, etc. Hence, there is less light lost due to radiation being absorbed by these internal structures of the LED.

DETAILED DESCRIPTION OF THE INVENTION

Figure 1:
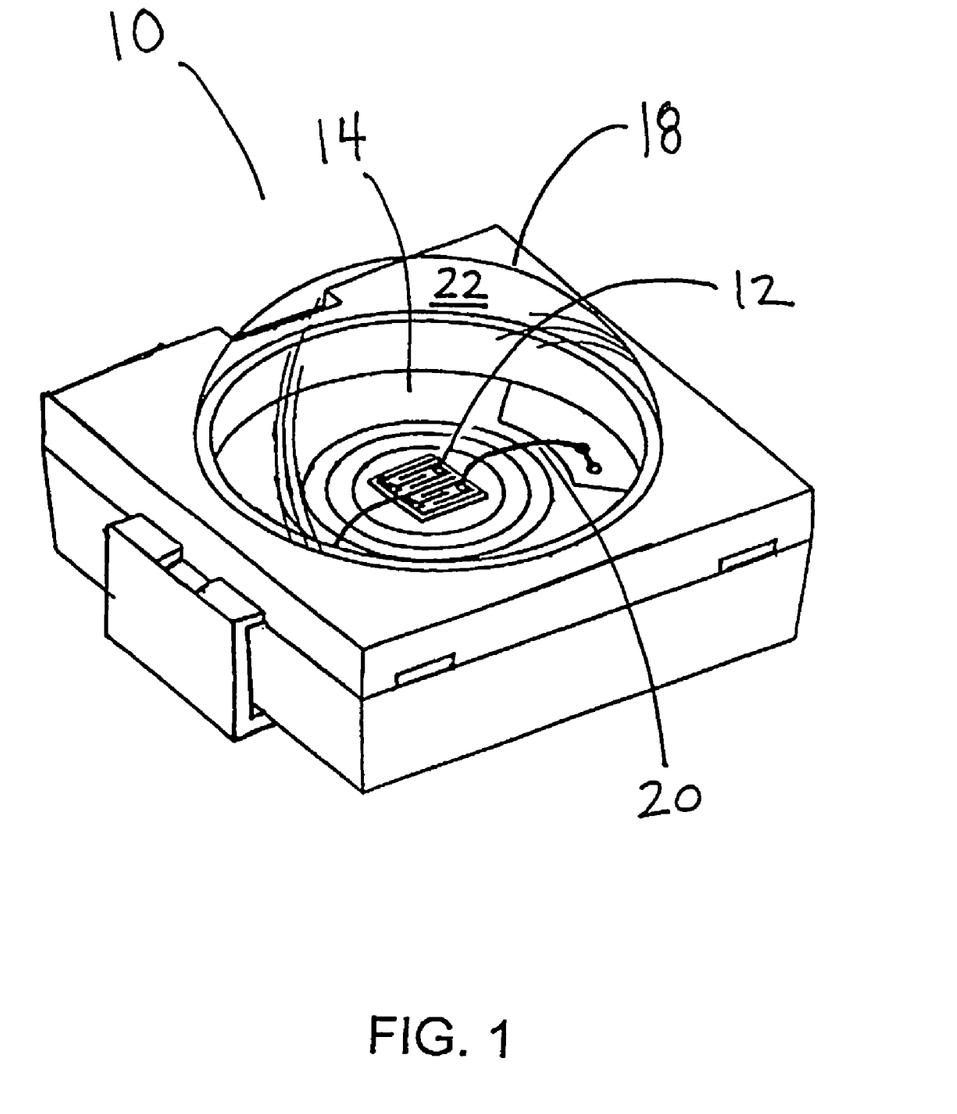
FIG. 1 is perspective view of a conventional LED package assembly.

Although the discussion below with respect to embodiments of the present invention is directed to LEDs for convenience, it should be understood that the invention relates to the use of any light emitting semiconductor. With reference to FIG. 1, a conventional LED assembly is shown generally at 10. The LED assembly includes an LED chip 12 mounted on a bottom surface 14 of the LED assembly. The LED chip 12 emits radiation (typically UV or blue light in a white light LED). A lens 18 made from a transparent material surrounds the chip 12 and bottom surface 14. Two lead wires 20 connect the chip 12 to a source of power. Filling the space 22 between the lens and the chip 12 is typically an epoxy or other transparent material (not shown). Intimately dispersed within the epoxy are phosphor particles (not shown) that absorb at least a portion of the light emitted by the chip 12 and converting it to a different wavelength.

While the performance of such LEDs can be adequate for some applications, they suffer from many of the drawbacks discussed above. Thus, the embodiments disclosed below seek to overcome some of the limitations of the conventional LEDs.

Figure 2:
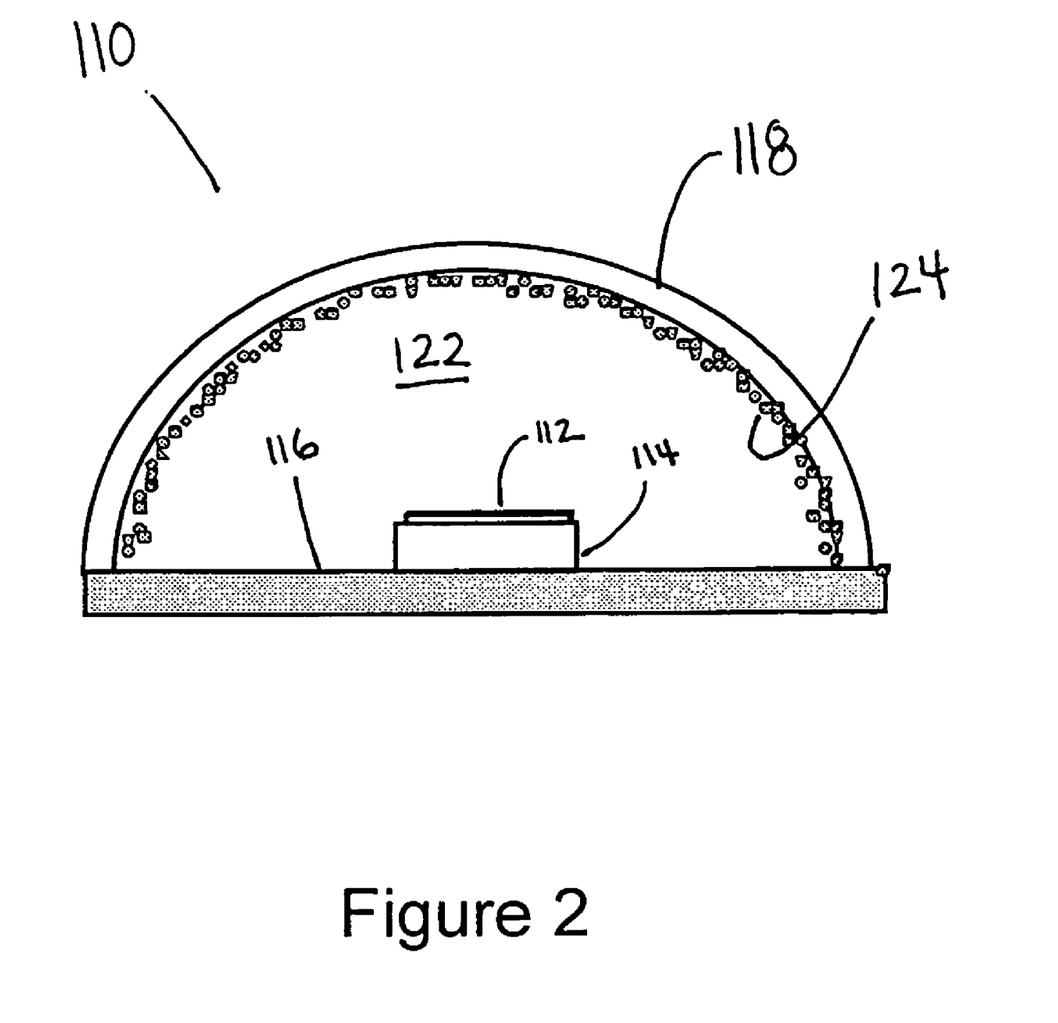
FIG. 2 is a cross-sectional view of an LED assembly according to a first embodiment of the present invention.

With reference to FIG. 2, a cross-sectional view of one embodiment of the invention is shown. In this embodiment, an LED package is provided generally at 110 and includes an LED chip 112 mounted on a submount 114, which in turn is mounted on a reflector 116. As used herein, "reflector" is meant to include not only any surface on the bottom of the LED package, but also any other structures meant to support the LED chip, e.g. a heat sink, etc. A lens 118 made from a transparent material surrounds the chip 112 and submount 114 and reflector 116. Optionally filling space 122 between the lens and the chip 112 is typically an epoxy or other transparent material. A phosphor layer 124 comprising phosphor particles is applied on an inside or outside surface of the lens 118. The coating is preferably coated on an inside surface of the lens to prevent the phosphor coating from being displace by handling, etc. The thickness of the phosphor coating should be sufficient to convert at least a portion of the radiation emitted by the LED chip to a different wavelength. This may typically be between 6-200 μm, with a preferred thickness being between 20-30 μm.

The LED chip 112 can be any conventional UV or blue light LED. Such LEDs are known and typically consist of InGaN or AlGaN layers epitaxially grown on a sapphire, alumina or single crystal SiC substrate. A preferred LED chip may have a primary emission in the range of 200-480 nm. Likewise, the phosphor layer 124 may include one or more suitable fluorescent phosphors capable of absorbing the UV or blue radiation and in turn of producing, either alone or in combination with the radiation emitted by the LED chip, a visible white or near-white light for illumination. Suitable phosphors for use in the present invention include, but are not limited to, $Y_3Al_5O_2$:Ce (YAG:Ce), $Tb_3Al_{4.9}O_{12}$:Ce (TAG:

Ce), and $Sr_4Al_{14}O_{25}$:Eu (SAE). Other white light producing phosphors are also suitable. The size of the phosphor particles is not critical, and may be, by way of example, about 3-30 µm in diameter.

The lens 118 may be made from any material that is substantially transparent to the radiation emitted by the phosphor and the LED chip. Thus, depending on the wavelength of the emitted radiation, the lens may comprise various materials including, but not limited to, glass, epoxy, plastic, thermoset or thermoplastic resins, or any other type of LED encapsulating material known in the art.

The providing of the phosphor coating 124 on an inside surface of the lens 118 rather than dispersed in the epoxy or other fill material provides a more uniform and efficient conversion of the LED emission. One advantage is that a uniform coating of controlled thickness may be applied. One benefit of this is that coating thickness can be accurately controlled for optimum conversion efficiency and UV bleed through (if a UV emitting chip is used) control using a minimum amount of phosphor. This helps to achieve uniform light emission without incidence of color rings resulting from non-uniform dispersion of the phosphor in prior art devices. Another benefit is that the phosphor is remote from the heat generated by the LED, further increasing the conversion efficiency. Of course, the phosphor layer may be positioned inside the lens material or have a coating of another material positioned over it, and such an arrangement is contemplated by the invention.

Although not intended to be limiting, the phosphor coating may be applied by, for example, spray coating, roller coating, meniscus or dip coating, stamping, screening, dispensing, rolling, brushing or spraying or any other method that can provide a coating of even thickness. A preferred method for applying the phosphor is by spray coating.

In an exemplary technique for coating the lens and reflector parts of the LED housing, the phosphor powder is first stirred into a slurry, along with a binder and a solvent. Suitable binders include, but are not limited to, silicone, epoxies, thermoplastics, acrylics, polyimides, and mixtures thereof. Suitable solvents include, but are not limited to, low boiling point solvents such as toluene, methyl ethyl ketone (MEK), methylene chloride, and acetone. The amount of each component in the slurry is not critical, but should be chosen so as to produce a slurry that is easily applied to the lens while also containing a sufficient concentration of phosphor particles for efficient conversion of the LED radiation. An exemplary slurry can be made using about 2 parts by weight of a 6 µm phosphor, 1.2 parts silicone, and 1 part MEK. A suitable silicone is GE XE5844.

The slurry is subsequently applied to the surface of the lens. The coated lens may then be baked, heated or otherwise treated to remove the solvent and cure the binder. As used herein, the term "cure" is meant to encompass not only actual curing or crosslinking of the binder, but also more generally to indicate any chemical and/or physical change in the binder to a where the phosphor particles become relatively stationary in the binder, typically due to a solidifying or hardening of the binder.

As noted above, the slurry can be applied to the lens via any suitable method. In a preferred method, the slurry is applied by spray coating. In this method, the slurry is used to fill the reservoir of a suitable air brush. The slurry is then sprayed using a pressurized spray gun onto the lens, which is preheated and kept on a hot plate at an elevated temperature preferably above the boiling temperature of the solvent, for example at about 110° C. The part is sprayed by making successive passes, which may be done at about ½ second per pass. The slurry dries on contact and a uniform coating is achieved. A coating approximately 4 layers thick (about 20-30 µm using 6 µm size phosphor particles) is achieved on the lens with 35-40 passes. The lens is then baked to cure the binder. It is planned that this approach to coating LED's would be used for any LED's for general illumination. If desired, a second coating of a transparent material may be added over the phosphor layer to protect the phosphor or to provide an overcoating to help light extraction.

A significant improvement in light output has been achieved using blue LED's with the YAG phosphor over the conventional coating method wherein the phosphor is embedded in the slurry and uniformly applied around the chip. Clearly there are many other ways to remotely the lens surrounding an LED chip. These would be considered within the scope of this invention;

In one preferred embodiment, the lens preferably has a radius that is at least about 2-3 times the length ("L") of one side of the chip. This arrangement increases the likelihood that radiation generated or reflected off a coating applied to such a lens is more likely to strike other parts of the coating, where it will be retransmitted, rather than the chip or other non-coated area, where it will be absorbed and lost.

In a second embodiment, illustrated in FIG. 3, an LED package is again provided at 210 and includes an LED chip 212 mounted on a submount 214, which in turn is mounted on a reflector 216. A lens 218 surrounds the chip 212 and submount 214 and reflector 216. Optionally filling space 222 between the lens and the chip 212 is typically an epoxy or other transparent material. To further improve efficiency, a phosphor coating 224 comprising phosphor particles is applied on an inside surface 226 of the lens 218 and on the top surface of the reflector 216. The top surface of the reflector, which may be thought of as the bottom of the package, is preferably first coated with a reflective layer 240, such as a high dielectric powder, such as, alumina, titania, etc. A preferred reflective material is $Al_2O_3$. The phosphor layer 224 is then placed over the reflective layer 240 on top of the reflector. The use of the reflective layer 240 serves to reflect any radiation 242 that penetrates the phosphor layer 224 on this surface. Alternately, instead of coating the transparent lens 118 with a separate phosphor layer 224, the phosphor may instead be intimately dispersed within the material comprising the transparent hemisphere.

Figure 3:
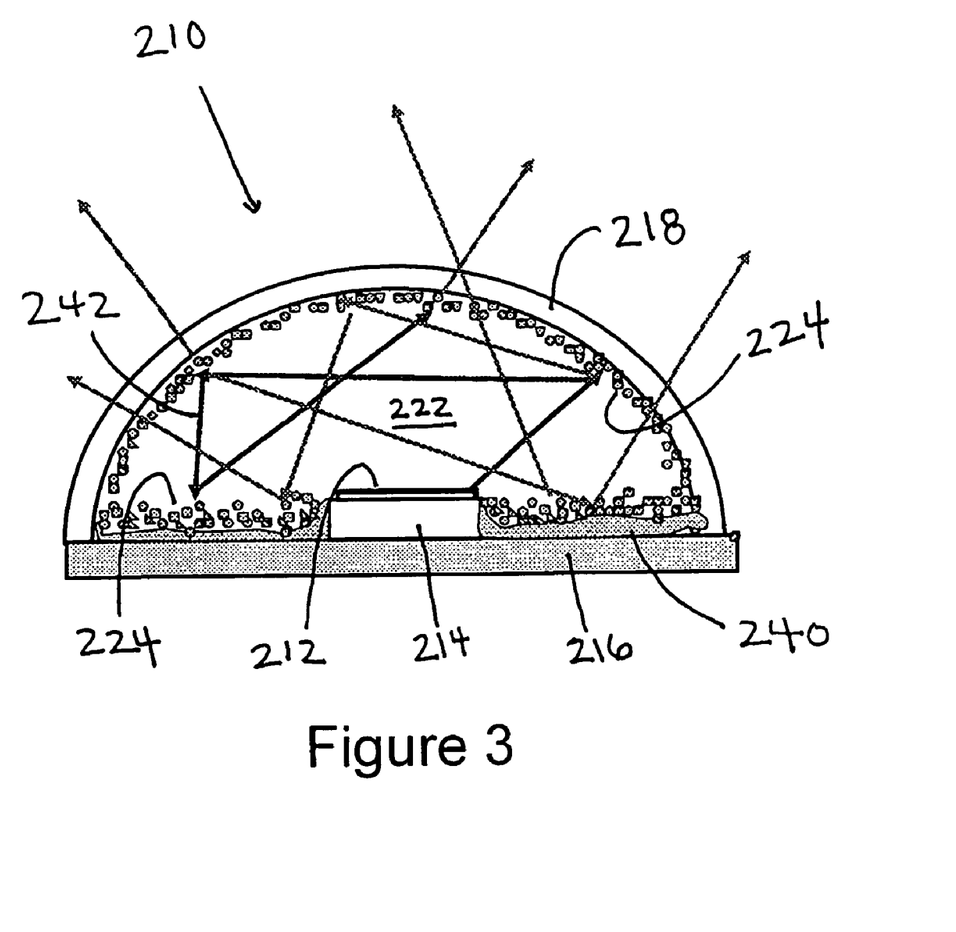
FIG. 3 is a cross-sectional view of an LED assembly according to a second embodiment of the present invention.

The phosphor layer 224 over the reflective layer 240 on the reflector 216 is preferably relatively thick, i.e. >5 layers of powder, while the phosphor layer on the curved top of the hemisphere may be adjusted to achieve a desired color and to absorb all radiation incident on it. In general the phosphor layer on the top of the hemisphere will range between 1-4 layers thick in the case of blue emitting chips in order that some of the blue radiation be emitted. In the case of UV chips the layer of phosphor coating on the hemisphere should be 4-8 layers thick in order to absorb at least most of the UV radiation emitted by the chip.

As shown in FIG. 3, radiation from the chip 242 is prevented from leaving the structure without first striking the phosphor coated surface of the hemisphere. Further, the total phosphor coated surface area is much greater than the surface area of the emitting chip, preferably at least 10 times the exposed surface area of the absorbing parts of the LED chip. As used herein, the exposed surface area of the absorbing parts of the LED include the exposed surface are of the LED chip as well as any exposed surface of the submount not covered with a reflective layer and/or a phosphor layer.

In such an arrangement, although there may be a significant amount of blue or UV radiation scattered back into the hemisphere, nearly all this radiation, which is diffusely scattered, strikes other parts of the phosphor coating rather than the chip or submount. Most of the visible light generated by the phosphor coating also is directed back into the hemisphere. Also there is no metallic reflector and no exposed lead structure. The important feature of this geometry is that everything except the LED chip 212 is phosphor covered and the phosphor surface area of the hemisphere is much larger, preferably >10 times, the surface area of any absorbing parts of the LED. Therefore, nearly all radiation going back into the hemisphere will strike other phosphor-coated areas and be either reflected or absorbed and retransmitted by the phosphor. The embodiments disclosed herein are calculated to have an efficiency greater than 70%, and in most cases approaching 100%.

In Table 1 the efficiency of this design is compared with several standard LED package geometries. These comparisons were made using a computer simulation. The computer simulation is a flux model described below. It considers all the radiation fluxes and assumes that all are diffuse so that the amount of radiation incident on any given surface is proportional to its area. As shown in Table 1 the geometry described above provides a package efficiency of essentially 100%.

TABLE 1

Comparison of Calculated Package Efficiencies of Two Standard Configurations of Phosphor Coated LED's with 3 Embodiments Disclosed in the Present Invention

| LED Description | Package Efficiency | | Milliwatts/lumen | |
| --- | --- | --- | --- | --- |
| | SiC substrate | $Al_2O_3$ substrate | SiC substrate | $Al_2O_3$ substrate |
| 1.6 $mm^2$ chip + 27 $mm^2$ reflector + phosphor on chip | 58% | 70% | 6.7 | 5.6 |
| 1.6 $mm^2$ chip + phosphor on chip | 69% | 80% | 5.7 | 4.9 |
| 1.6 $mm^2$ chip + 27 $mm^2$ reflector + phosphor on lens (FIG. 5) | 82% | 88% | 4.7 | 4.4 |
| 1.6 $mm^2$ chip + 3 mm radius hemisphere (FIG. 3) | 98% | 99% | 4 | 3.9 |
| 1.6 $mm^2$ chip + 3 mm radius sphere (FIG. 4) | 99% | 100% | 3.9 | 3.9 |

Figure 4:
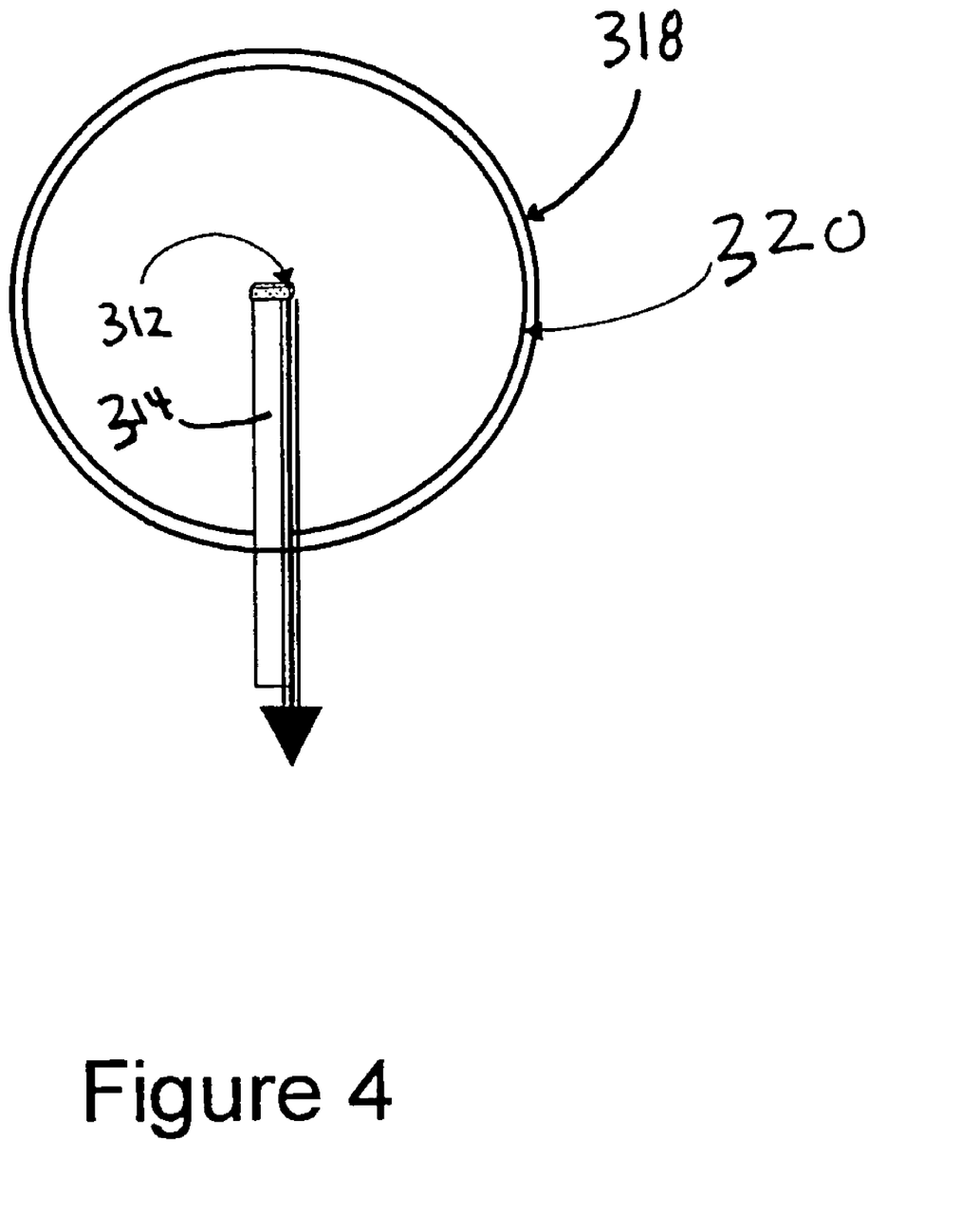
FIG. 4 is a cross-sectional view of an LED assembly according to a third embodiment of the present invention.

FIG. 4 shows a second embodiment operating under the same principle. Here an LED chip 312 is mounted on a pedestal 314 which also serves as the heat sink. However, the chip 312 is placed at the center of a molded sphere 318. A phosphor layer (not shown) is then coated on the inside surface 320 of the sphere 318 or, alternately, intimately dispersed within the sphere. In this design the LED will radiate uniformly in all directions. Again, it is clear that both blue/UV radiation and visible radiation generated by the phosphor coating and scattered back into the sphere will be more likely to strike other phosphor coated surfaces in preference to striking either the chip 312 or the pedestal 314. These light absorbing structures are small targets for the diffuse radiation. As seen in Table 1, the package efficiency is close to 100% for this arrangement. The lower package efficiency for LED structure on SiC substrates are due to greater absorption of the LED radiation by the SiC substrate as compared to the $Al_2O_3$ substrate.

From the previous embodiments, It is apparent that the specific shape of the phosphor coating is not important as long as it surrounds as completely as possible the LED chip and is a distance sufficient from this chip (e.g. a distance such that the phosphor coated surface has a surface area greater than about 10 times the exposed surface area of the chip) such that radiation scattered from the coating is unlikely to strike the chip or chip structures. The invention is not limited to the embodiments described herein but intended to embrace all such coating shapes, and preferably wherein the phosphor covered surfaces has approximately 10 times the exposed area of the absorbing parts of the LED or greater. Thus, the lens on which the phosphor is coated is not limited to hemispherical or spherical, but can include any geometric shape, preferably with the phosphor coated surface area being about at least 10 times the exposed area of the absorbing parts of the LED.

Figure 5:
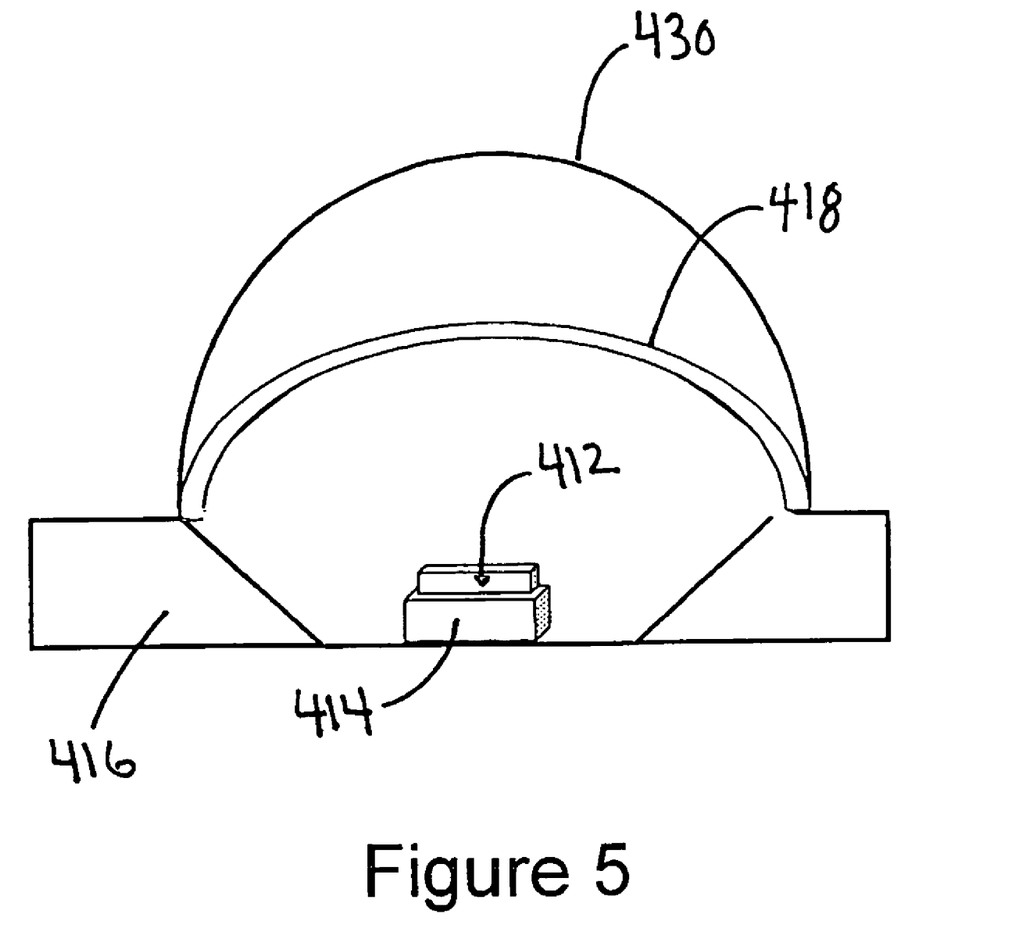
FIG. 5 is a cross-sectional view of an LED assembly according to a fourth embodiment of the present invention.

The invention is also intended to cover geometries which are not so ideal and perhaps do not give the full advantage of 100% package efficiency but nevertheless do utilize the principle of a remote phosphor coating designed so that the coated surface is at least 10 times the emitting area of the chip. For example FIG. 5 shows a schematic of a conventional surface mount LED. In this arrangement, the LED chip 412 and submount 414 are mounted in a reflector cup 416. Unlike the conventional design (described in the background above), which has the phosphor embedded more or less randomly in an optical medium between reflector and the lens, the phosphor coating is applied as a layer on a transparent lens 418. The phosphor coating is remote from the chip 412 and on a surface with about >10 times the exposed area of the absorbing parts of the LED. Obviously, the surface of the lens 418 on which the phosphor coating is applied can have a surface area less than 10 times the surface area of the chip. However, the package efficiency of the assembly will be reduced accordingly, since more of the radiation will strike and be absorbed by the chip. Again, a second lens 430 can be mounted over the phosphor coated lens for protection.

Most of the UV or blue radiation and visible radiation which is scattered back from the phosphor coating strikes either the reflector cup 416 or other phosphor surface. Only a relatively small amount strikes the light absorbing chip and submount. In this design it is important that the reflector cup 416 be made of a very highly reflective material, for example a vapor deposited and protected silver coating with >95% reflectivity or an inorganic powder of high purity, such as finely divided alumina or titania. In addition the reflector cup 416 may or may not be coated with the phosphor. Table 1 shows the simulated performance of a specific LED with an area of 1.6 $mm^2$ on a submount in a silver reflector cup utilizing a phosphor coated lens of area of 27 $mm^2$.

Figure 6:
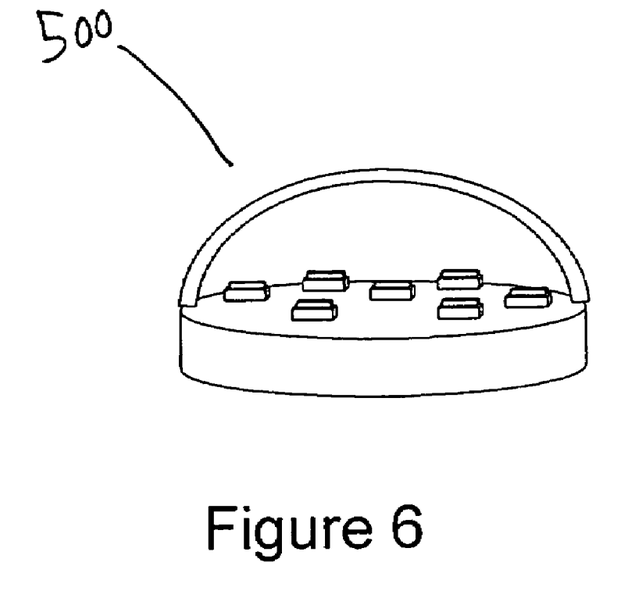
FIG. 6 is a side perspective view of an LED assembly according to a fourth embodiment of the present invention.
Figure 7:
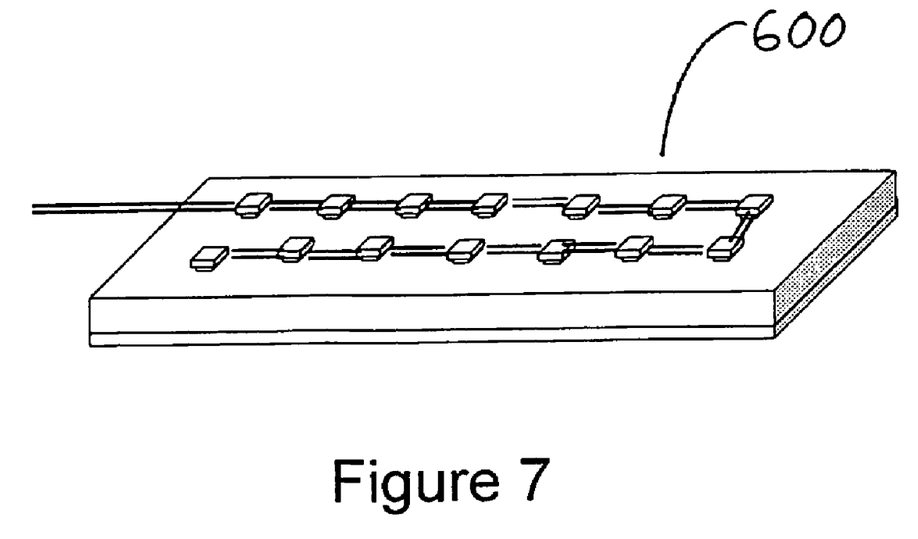
FIG. 7 is a side perspective view of an LED assembly according to a fourth embodiment of the present invention.

As shown in FIGS. 6 and 7, the present invention also discloses the concept of a remote phosphor coating as applied to systems containing multiple LED chips. Multiple blue or UV emitting LED's can be mounted on a single reflective electrical interconnect board or other structure. A phosphor coated surface then is used to surround not a single LED but the entire set of LED's. The phosphor coated surface may be used alone or in combination with other highly reflecting surfaces to surround the set of LED's. Two examples of such structures are shown in FIGS. 6 and 7. One is a power module 500 which might be used as a downlight. The other is a panel lamp 600 with many LED's mounted behind a phosphor coated panel. It is clear that many such arrangements could be made provided that the phosphor surface area is the preferred 10 times the exposed area of the absorbing parts of the LED.

As detailed above, any of the embodiments may include an epoxy or other transparent filler between the LED chip and the phosphor coated lens. More efficient extraction of light can be realized when the refractive index of the encapsulant or transparent filler is closely matching the geometric mean of the refractive indexes of the die and the lens, preferably within about 20% of this value, and even more preferably within about 10%. This reduces the amount of internal reflections in the lamp. Thus, in the case of a GaN LED chip having a refractive index of about 2.7 with a lens having a refractive index of about 1.5, the filler will preferably have a refractive index of from about 2.1. In the case of an LED chip having two or more materials having different refractive indices, such as a GaN semiconductor on a sapphire submount having a refractive index of about 1.7, the refractive index of the encapsulant will preferably match the geometric mean of the lens and the higher of the two. Better light extraction can thus be achieved with encapsulants having a higher index of refraction than epoxy, such as spin-on glass (SOG) or other high refractive index materials.

Figure 9:
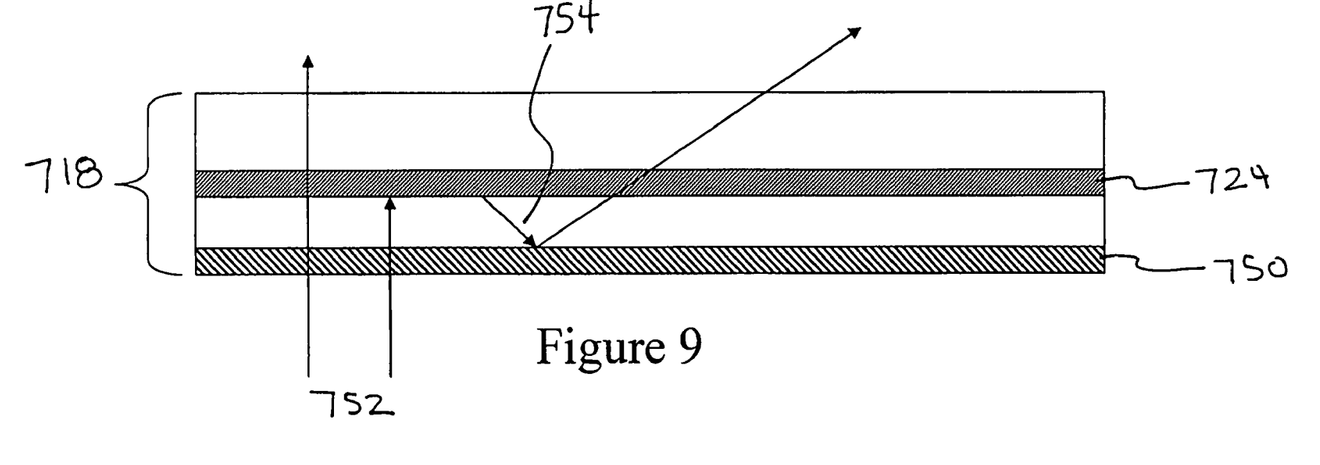
FIG. 9 is a cross-sectional view of a lens for a blue LED source containing a band pass filter.

Any of the above embodiments can also be equipped with one or more band pass filters to further improve the efficiency of the resulting LED package. Thus, in one embodiment, as shown in FIG. 9, a lens 718 for a blue LED source is shown containing a first band pass filter 750. The band pass filter is positioned between the phosphor layer 724 and the LED (not shown). The band pass filter is selected such that the incident light from the blue LED source 752 is allowed to pass while the light emitted from the phosphor layer 754 is reflected outward.

Figure 10:
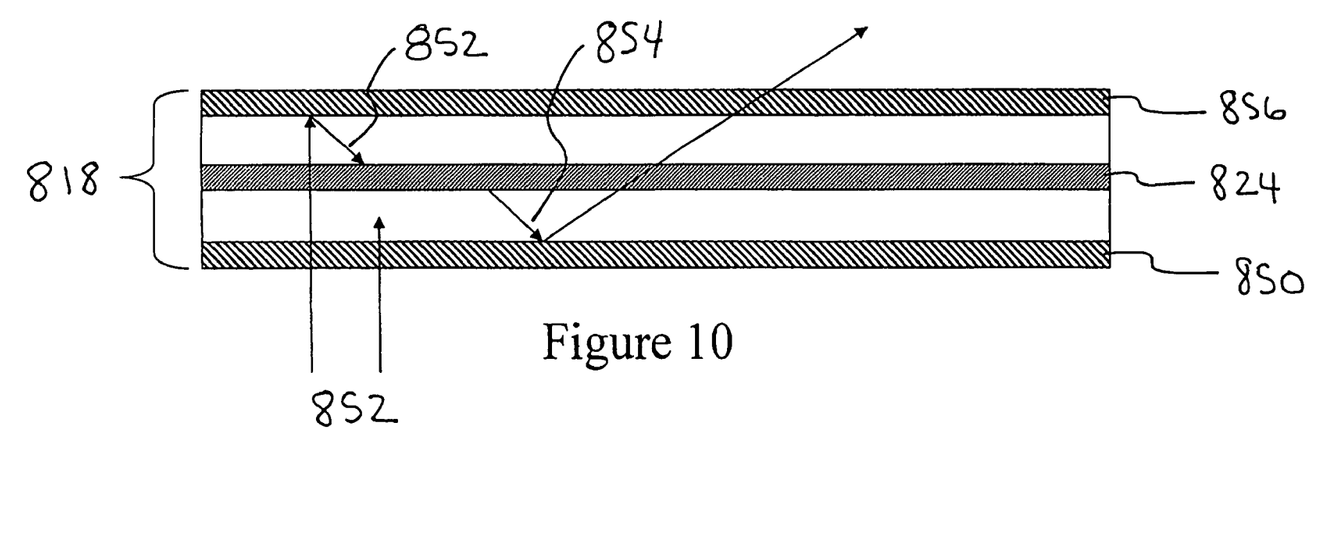
FIG. 10 is a cross-sectional view of a lens for a UV LED containing multiple band pass filters.

In the embodiment shown in FIG. 10, two band pass filters are provided in a UV LED source package. In this embodiment, a first band pass filter 850 is positioned between the phosphor layer 824 and the LED source (not shown) adjacent a lens 818. The first band pass filter acts to transmit the UV light 852 from the LED while reflecting the light emitted from the phosphor layer 854. A second band pass filter 856 reflects the UV light from the LED 852 while allowing the light emitted from the phosphor layer 854 to pass. This arrangement prevents the transmission of potentially harmful UV radiation from the package while ensuring transmission of visible light.

Figure 11:
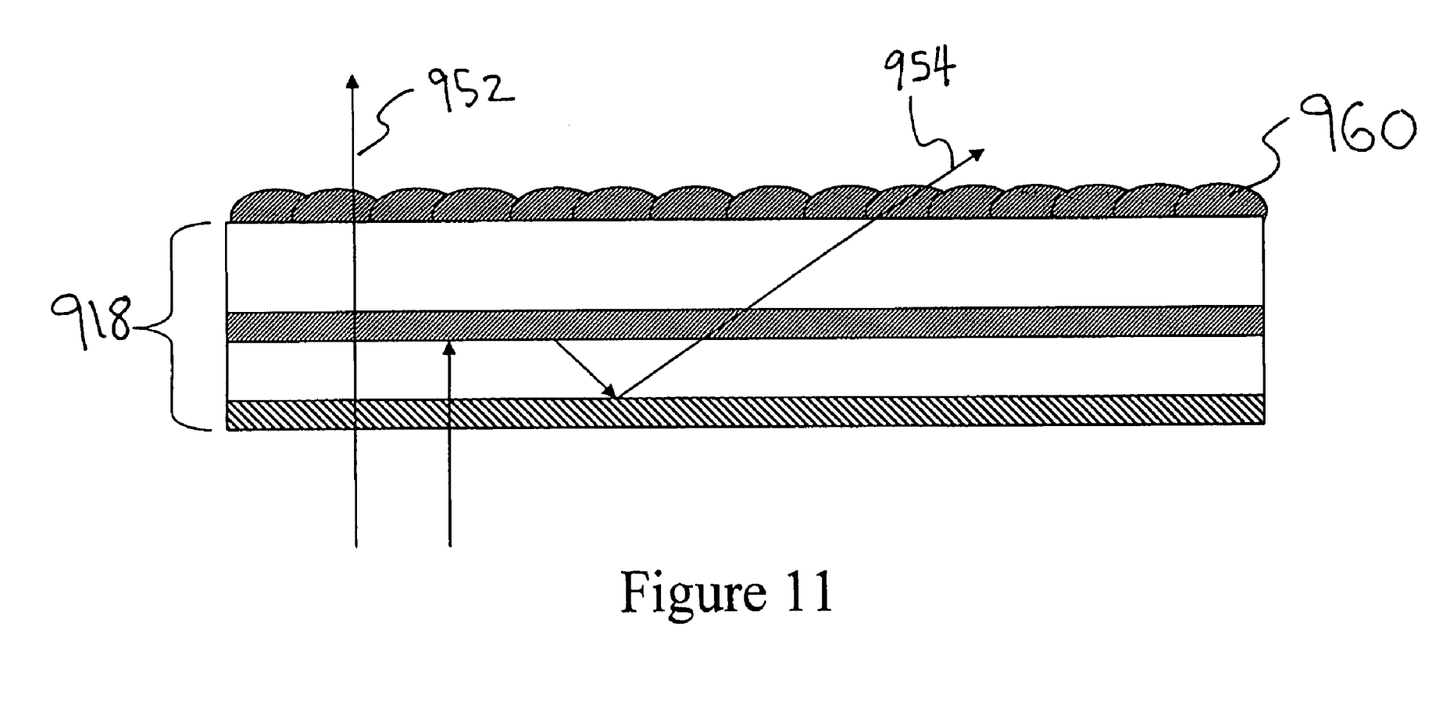
FIG. 11 is a cross-sectional view of a lens containing an array of micro or macro lenses is formed on the outer surface of the lens to control the emission angle, direction or intensity of the emitted radiation.

As seen in FIG. 11, an array of micro or macro lenses 960 may be formed on the outer surface of the lens 918 in any of the above embodiments to control the emission angle, direction or intensity of the emitted radiation 952 and 954.

Figure 8:
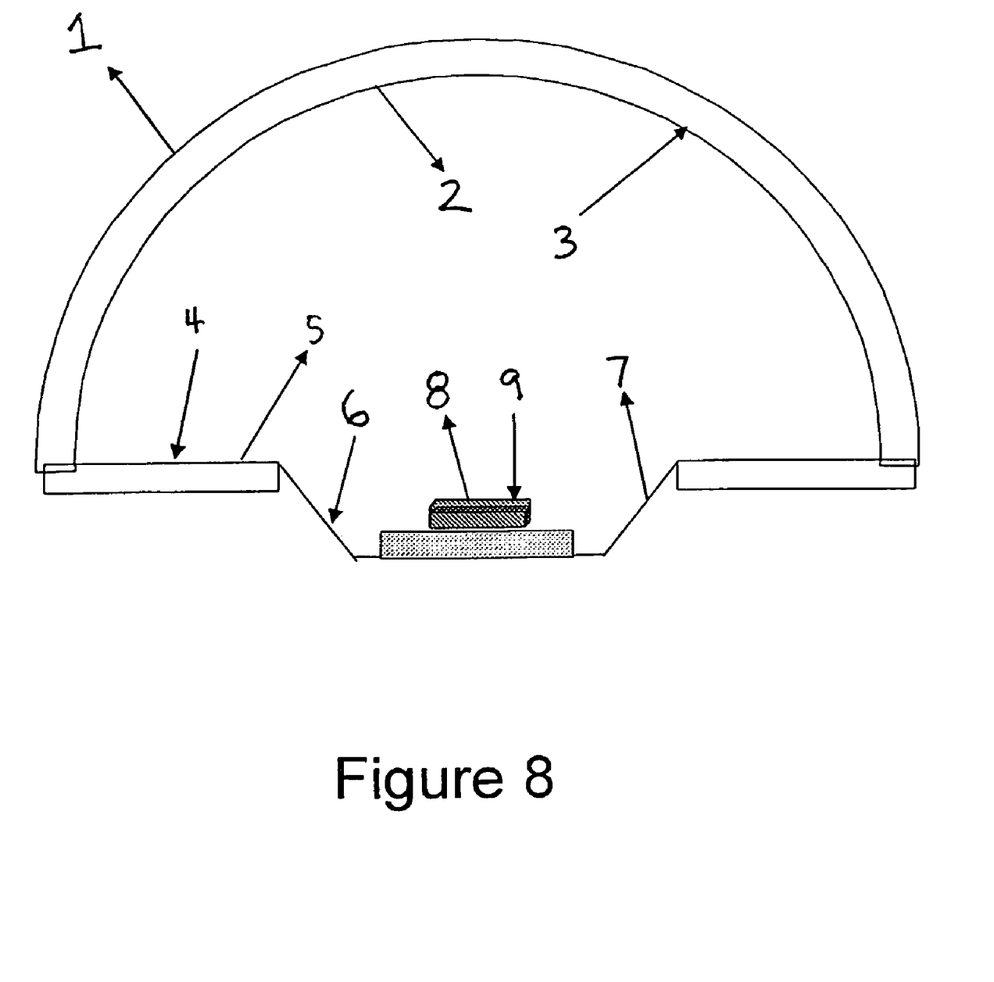
FIG. 8 is a representation of an LED assembly according to an embodiment of the present invention depicting flux lines for radiation incident on its various surfaces.

The calculation results shown in Table 1 are based on a linear flux model illustrated in the FIG. 8. The figure shows nine fluxes incident on four surfaces of the LED package. These fluxes are described by the nine linear equations below, with each equation describing the flux with the corresponding number. The equations are:

1. $L_3^{out} = L_3^+ t_3^{VIS}$

2. $L_3^- = L_3^+ r_3^{VIS} + I_3^+ a_3^{UV} Q(\bar{\lambda}_l/\bar{\lambda}_L)\left(\frac{1}{2}\right)$ 3. $L_3^+ = L_2^- p_{23} + L_1^- p_{13} + L_0^- p_{03} + I_3^+ a_3^{UV} Q(\bar{\lambda}_l/\bar{\lambda}_L)\frac{1}{2}$ 4. $L_2^+ = L_3^- p_{32} + L_1^- p_{12} + L_0^- p_{02} + I_2^+ a_2^{UV} Q(\bar{\lambda}_l/\bar{\lambda}_L)\frac{1}{2}$ 5. $L_2^- = L_2^+ r_2^{VIS}$ 6. $L_1^+ = L_3^- p_{31} + L_2^- p_{21} + L_0^- p_{01}$ 7. $L_1^- = L_1^+ r_1^{VIS}$ 8. $L_0^+ = L_3^- p_{30} + L_2^- p_{20} + L_1^- p_{10}$ 9. $L_0^- = L_0^+ r_0^{VIS}$ These surfaces are:
3=the upper phosphor coated surface,
2=the lower phosphor coated surface,
1=the reflector and submount, and
0=the blue or UV emitting chip.

There are nine other equations describing the blue or UV fluxes. The equations describing the blue or UV fluxes are not shown. They are coupled to the visible light equations through the quantum efficiency Q and the Stoke's shift ($\lambda i/\lambda l$). The eighteen linear equations result in eighteen unknowns, i.e. the relative powers of radiation striking each surface, and are solved simultaneously.

The p values are the probabilities that radiation from one surface will strike another. In the calculations shown in Table I these were taken to be the ratios of surface areas. Q is the quantum efficiency of the phosphor. $\lambda$ is the average wavelength of the blue or UV chip radiation or the average wavelength of the visible emission of the phosphor.

The other parameters needed are the reflectivities and absorptivities of the different material surfaces. These were obtained either from Handbook values or were measured directly using known methods. There are no values for the reflectivities of the chips and so these were calculated by assuming that each chip consisted of the semiconductor layers and substrate. All radiation incident on the chip was assumed to be normal and incident on the substrate in a flip-chip design and diffraction effects were ignored. Up to second order the expression for the reflectivity of the chip is then:

$$R = R_{sub} + (1-R_{sub})^2 \exp(-2a_{sub}t_{sub})R_{act} + (1-R_{sub})^2 \exp(-2a_{sub}t_{sub})(1-R_{act})^2 \exp(-2a_{act}t_{act})R_{mst}$$

where:
$R_{sub}$=reflectivity of substrate
$a_{sub}$=absorption cost of sub
$t_{sub}$=thickness of substrate
$R_{act}$=reflectivity of active layers
$a_{act}$=absorption coefficient of active layers Known or estimated values were used for the indices of refraction, the absorption coefficients and thicknesses. Thus, $$R = ((n1-n2)^2 + k^2)/(n1+n2)^2 + k^2), \text{ where } k=\lambda a/2\pi.$$

The invention has been described with reference to the preferred embodiments. Obviously, modifications and alterations will occur to others upon reading and understanding the preceding detailed description. It is intended that the invention be construed as including all such modifications and alterations.

The invention claimed is:

1. An LED device comprising:
   a light emitting semiconductor;
   a cover over said semiconductor and spaced apart therefrom; and
   a phosphor layer contained within or coated on an inside or outer surface of said cover, wherein said inside surface of said cover has a surface area at least ten times the exposed surface area of the light emitting semiconductor.

2. An LED device according to claim 1, further comprising a transparent filler positioned between said light emitting semiconductor and said cover.

3. An LED device according to claim 2, wherein said transparent filler is an optical coupling material which may be an epoxy, silicone, acrylic, thermoplastic, urethane, polyimide or an index modified matching fluid or gel.

4. An LED device according to claim 3, wherein said filler has an refractive index closely matching the geometric mean of the refractive index of said light emitting semiconductor and said cover material.

5. An LED device according to claim 1, wherein said phosphor layer has a substantially uniform thickness.

6. An LED device according to claim 1, wherein said phosphor layer is formed from a slurry comprising one or more phosphors and a binder.

7. An LED device according to claim 6, wherein said slurry may contain a carrier solvent and said binder is a transparent refractive index matching material.

8. An LED device according to claim 7, wherein said solvent is methyl ethyl ketone and said binder is selected from the group consisting of silicone, acrylic, epoxy, thermoplastic and polyimide.

9. An LED device according to claim 1, wherein said phosphor layer is formed from a slurry comprising one or more phosphors, a scattering medium and a binder.

10. An LED device according to claim 1, wherein said phosphor layer comprises one or more of $Y_3Al_5O_2$:Ce, $Tb_3Al_{4.9}O_{12}$:Ce, $Sr_4Al_{14}O_{25}$:Eu, and mixtures thereof.

11. An LED device according to claim 1, wherein said light emitting semiconductor is a blue emitting LED or a UV emitting LED having a primary emission in the range of 200-480 nm.

12. An LED device according to claim 1, wherein said LED device emits white light.

13. An LED device according to claim 1, having a package efficiency of 70% or greater.

14. An LED device according to claim 1, wherein said lens comprises a sphere or hemisphere and said light emitting semiconductor is positioned at the center of said sphere or hemisphere.

15. An LED device comprising:
a light emitting semiconductor;
a cover over said semiconductor and positioned apart from the light emitting semiconductor by a distance at least about two times the length of a longest side of said light emitting semiconductor; and
a phosphor layer contained within or coated on an inside or outer surface of said cover.

16. An LED device comprising:
a light emitting semiconductor;
a reflector supporting said light emitting semiconductor;
a cover over said semiconductor and said reflector and spaced apart from said semiconductor; and
a uniform thickness phosphor layer coated on at least a portion of said reflector and contained within or coated on an inside or outer surface of said cover, the light emitting semiconductor, reflector, cover, and phosphor layer defining an LED device having a package efficiency of 70% or greater.

17. An LED device according to claim 16, further comprising a reflective layer positioned between said phosphor layer and said reflector.

18. An LED device according to claim 17, wherein said reflective layer comprises a high dielectric powder.

19. An LED device according to claim 16, further comprising a submount on which said semiconductor is mounted, wherein said submount is also coated with said phosphor layer.

20. An LED device according to claim 16, wherein said phosphor layer is from 6 to 100 μm thick.

21. An LED device according to claim 16, wherein said semiconductor is a blue or UV emitting LED in the range of 200-480 nm.

22. An LED device according to claim 16, wherein said LED chip is free of said phosphor coating.

23. A method for forming an LED device having a cover with a uniform phosphor coating, said method comprising the steps of:
providing an LED mounted on a support;
providing a cover sized to fit over or around said support;
depositing a uniform thickness phosphor coating on a surface of said cover; and
assembling said LED, mount and lens to form said LED device.

24. A method according to claim 23, wherein said step of depositing said phosphor on said cover comprises the sub-steps of:
forming a slurry comprising phosphor powder, a solvent and a binder;
optionally heating said cover to a temperature above room temperature;
stamping, screening, dispensing, rolling, brushing or spraying said slurry onto said lens to achieve a uniform thickness coating layer; and
curing said binder to form a permanent coating layer.

25. An LED device comprising;
a plurality of light emitting semiconductors mounted on a reflective electrical interconnect board;
a cover over said semiconductors and spaced apart from said semiconductors; and
a phosphor layer contained within or coated on an inside or outer surface of said cover, wherein the phosphor layer has an area greater than about ten times an exposed surface area of the light emitting semiconductor.

26. An LED device according to claim 25 in which said cover has a refractive index matching a refractive index of said light emitting semiconductors for improved light extraction and chip protection.

27. A LED device according to claim 25, wherein said plurality of light emitting semiconductors comprise blue LEDs, said device further comprising a band pass light filter positioned on said cover between the phosphor layer and said blue LEDs, said band pass filter functioning to pass the emission wavelength of the LEDs and reflect the emission wavelength of the phosphor layer.

28. A LED device according to claim 25, wherein said plurality of light emitting semiconductors comprise UV LEDs, said device further comprising a first band pass light filter positioned on said cover between the phosphor layer and said blue LEDs, for passing the emission wavelength of the LEDs and reflecting the emission wavelength of the phosphor layer, and a second band pass light filter positioned on an exterior surface of said cover for passing the emission wavelength of the phosphors and reflecting the emission wavelength of the LEDs.

29. A LED device according to claim 25 in which an array of micro or macro lenses is formed on the outer surface of the cover to control the emission angle, direction or intensity of the emitted radiation.

30. A LED device according to claim 25 in which the cover is easily detachable from said LED device such that additional covers containing different phosphor mixes or amounts can be installed to easily adjust the light color temperature, CIE and CRI without changing the light emitting semiconductors.

* * * * *

(12) EX PARTE REEXAMINATION CERTIFICATE (9881st)
United States Patent
Soules et al.

(10) Number: US 7,479,662 C1
(45) Certificate Issued: Oct. 17, 2013

(54) COATED LED WITH IMPROVED EFFICIENCY

(75) Inventors: Thomas F. Soules, Livermore, CA (US); Stanton Weaver, Jr., Northville, NY (US); Chen-Lun Hsing Chen, Sanchong (TW); Mathew Sommers, Sagamore Hills, OH (US); Boris Kolodin, Beachwood, OH (US); Anan Achyut Setlur, Niskayuna, NY (US); Thomas Elliot Stecher, Scotia, NY (US)

(73) Assignee: Gelcore LLC, Valley View, OH (US)

Reexamination Request:
No. 90/011,805, Jul. 22, 2011

Reexamination Certificate for:
Patent No.: 7,479,662
Issued: Jan. 20, 2009
Appl. No.: 10/525,697
Filed: Mar. 23, 2006

(21) Appl. No.: 90/011,805
(22) PCT Filed: Aug. 29, 2003
(86) PCT No.: PCT/US03/27363
§ 371 (c)(1), (2), (4) Date: Mar. 23, 2006
(87) PCT Pub. No.: WO2004/021461
PCT Pub. Date: Mar. 11, 2004

Related U.S. Application Data
(60) Provisional application No. 60/407,426, filed on Aug. 30, 2002.

(51) Int. Cl.
*H01L 29/22* (2006.01)
(52) U.S. Cl.
USPC .............................................. 257/98
(58) Field of Classification Search
None
See application file for complete search history.

(56) References Cited

To view the complete listing of prior art documents cited during the proceeding for Reexamination Control Number 90/011,805, please refer to the USPTO's public Patent Application Information Retrieval (PAIR) system under the Display References tab.

*Primary Examiner* — Leonardo Andujar (57) ABSTRACT

An LED device including an LED chip and a lens positioned apart from the chip and coated with a uniform thickness layer of fluorescent phosphor for converting at least some of the radiation emitted by the chip into visible light. Positioning the phosphor layer away from the LED improves the efficiency of the device and produces more consistent color rendition. The surface area of the lens is preferably at least ten times the surface area of the LED chip. For increased efficiency, the reflector and submount can also be coated with phosphor to further reduce internal absorption.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 5, 6, 10-12, 14, 23 and 24 are cancelled.

Claims 2, 4, 7, 9, 13, 15, 25-28 and 30 are determined to be patentable as amended.

Claims 3, 8 and 29, dependent on an amended claim, are determined to be patentable.

Claims 16-22 were not reexamined.

2. An LED device [according to claim 1, further] comprising*:*
   a light emitting semiconductor;
   a cover over said semiconductor and spaced apart therefrom;
   *a phosphor layer contained within or coated on an inside or outer surface of said cover, wherein said inside surface of said cover has a surface area at least ten times the exposed surface area of the light emitting semiconductor; and*
   a transparent filler positioned between said light emitting semiconductor and said cover.

4. An LED device according to claim 3, wherein said filler has [an] *a* refractive index closely matching the geometric mean of the refractive index of said light emitting semiconductor and said cover material.

7. An LED device [according to claim 6,] *comprising:*
   *a light emitting semiconductor;*
   *a cover over said semiconductor and spaced apart therefrom; and*
   *a phosphor layer contained within or coated on an inside or outer surface of said cover, wherein said inside surface of said cover has a surface area at least ten times the exposed surface area of the light emitting semiconductor;*
   wherein said phosphor layer is formed from a slurry comprising one or more phosphors and a binder; and
   wherein said slurry may contain a carrier solvent and said binder is a transparent refractive index matching material.

9. An LED device [according to claim 1,] *comprising:*
   *a light emitting semiconductor;*
   *a cover over said semiconductor and spaced apart therefrom; and*
   *a phosphor layer contained within or coated on an inside or outer surface of said cover, wherein said inside surface of said cover has a surface area at least ten times the exposed surface area of the light emitting semiconductor;*
   wherein said phosphor layer is formed from a slurry comprising one or more phosphors, a scattering medium and a binder.

13. An *LED device comprising:*
   *one or more light emitting semiconductor chips;*
   *a cover over said one or more semiconductor chips and spaced apart therefrom; and*
   *a phosphor layer contained within or coated on an inside or outer surface of said cover, wherein said inside surface of said cover has a surface area at least ten times the exposed surface area of the one or more light emitting semiconductor chips;*
   wherein the LED device [according to claim 1, having] *has* a package efficiency of 70% or greater.

15. An LED device comprising:
   a light emitting semiconductor *chip*;
   a cover over said *light emitting* semiconductor *chip* and positioned apart from the light emitting semiconductor *chip* by a distance at least about two times the length of a longest side of said light emitting semiconductor *chip*; and
   a phosphor layer contained within or coated on an inside or outer surface of said cover.

25. An LED device comprising;
   a plurality of light emitting [semiconductors] *semiconductor chips* mounted on a reflective electrical interconnect board;
   a cover over said [semiconductors] *light emitting semiconductor chips* and spaced apart from said [semiconductors] *light emitting semiconductor chips*; and
   a phosphor layer contained within or coated on an inside or outer surface of said cover, wherein the phosphor layer has an area greater than about ten times an exposed surface area of the *plurality of* light emitting semiconductor *chips*.

26. An LED device according to claim 25 in which said cover has a refractive index matching a refractive index of said light emitting [semiconductors] *semiconductor chips* for improved light extraction and chip protection.

27. A LED device according to claim 25, wherein said plurality of light emitting [semiconductors] *semiconductor chips* comprise blue [LEDs] *light emitting semiconductor chips*, said device further comprising a band pass light filter positioned on said cover between the phosphor layer and said blue [LEDs] *light emitting semiconductor chips*, said band pass filter functioning to pass the emission wavelength of the [LEDs] *light emitting semiconductor chips* and reflect the emission wavelength of the phosphor layer.

28. A LED device according to claim 25, wherein said plurality of light emitting [semiconductors] *semiconductor chips* comprise UV [LEDs] *light emitting semiconductor chips*, said device further comprising a first band pass light filter positioned on said cover between the phosphor layer and said blue [LEDs] *light emitting semiconductor chips,* for passing the emission wavelength of the [LEDs] *light emitting semiconductor chips* and reflecting the emission wavelength of the phosphor layer, and a second band pass light filter positioned on an exterior surface of said cover for passing the emission wavelength of the phosphors and reflecting the emission wavelength of the [LEDs] *light emitting semiconductor chips*.

30. A LED device according to claim 25 in which the cover is easily detachable from said LED device such that additional covers containing different phosphor mixes or amounts can be installed to easily adjust the light color temperature, CIE and CRI without changing the light emitting [semiconductors] *semiconductor chips*.

\* \* \* \* \*